United States Patent [19]
Houston

[11] Patent Number: 5,541,882
[45] Date of Patent: Jul. 30, 1996

[54] METHOD OF PERFORMING A COLUMN DECODE IN A MEMORY DEVICE AND APPARATUS THEREOF

[75] Inventor: Theodore W. Houston, Richardson, Tex.

[73] Assignee: Texas Instruments Incorporated, Dallas, Tex.

[21] Appl. No.: 369,951

[22] Filed: Jan. 9, 1995

[51] Int. Cl.⁶ .................................................. G11C 7/00
[52] U.S. Cl. ..................................... 365/194; 365/230.06
[58] Field of Search ........................... 365/194, 189.01, 365/189.05, 230.06; 327/261, 269

[56] References Cited

U.S. PATENT DOCUMENTS

| | | | |
|---|---|---|---|
| 3,970,873 | 7/1976 | Banfi | 327/185 |
| 4,623,990 | 11/1986 | Allen et al. | 365/189.05 X |
| 4,851,711 | 7/1989 | Chan et al. | 327/172 X |
| 4,985,865 | 1/1991 | Houston | 365/194 |
| 5,124,573 | 6/1992 | Wong | 327/172 |

*Primary Examiner*—David C. Nelms
*Assistant Examiner*—Son Dinh
*Attorney, Agent, or Firm*—Mark A. Valetti; W. James Brady, III; Richard L. Donaldson

[57] ABSTRACT

A delay circuit (10) for a memory device introduces asymmetrical delay to prevent a false write operation from being performed by the memory device, The asymmetrical delay can be disabled during read operations in response to a control signal (CS) in order to allow for fast column access.

20 Claims, 2 Drawing Sheets

METHOD OF PERFORMING A COLUMN DECODE IN A MEMORY DEVICE AND APPARATUS THEREOF

TECHNICAL FIELD OF THE INVENTION

The present invention relates in general to memory accessing circuits and more particularly to a method of performing a column decode in a memory device and apparatus thereof.

BACKGROUND OF THE INVENTION

Memory devices are susceptible to performing a false write operation due to problems inherent in the column decode circuitry. Therefore, it is desirable to have a column decode circuitry that prevents a false write operation from being performed by the memory device.

SUMMARY OF THE INVENTION

From the foregoing, it may be appreciated that a need has arisen for a column decode circuit that prevents the operation of a false write within a memory device. A need has also arisen for a column decode circuit that prevents a false write operation without adversely effecting the read operation of a memory device.

In accordance with the present invention, a method of performing a column decode in a memory device and apparatus thereof are provided that substantially eliminate or reduce disadvantages and problems associated with conventional memory devices.

According to an embodiment of the present invention, there is provided a column decode circuit for a memory device that includes a delay circuit operable to receive an address bit. The delay circuit generates an address signal in response to the address bit by introducing an asymmetrical delay during generation of the column decode signal.

The present invention provides various technical advantages over conventional memory devices. For example, one technical advantage is in preventing a false write operation from being performed by the memory device. Another technical advantage is in introducing an asymmetrical delay into the column decode signal generation. Yet another technical advantage is in not allowing the asymmetrical delay to effect the read operation of a memory device. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
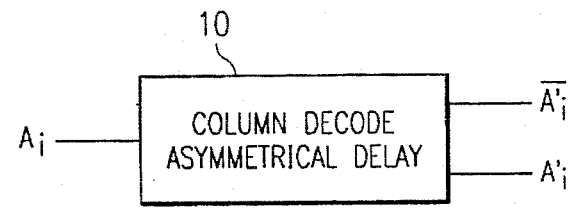
FIG. 1 illustrates a block diagram of a single bit column decode circuit.

FIG. 1 is a block diagram of a delay circuit 10 that decodes a single address bit for use in a column address decode circuit of a memory device. Delay circuit 10, in response to address bit $A_i$, generates address signals $A'_i$, and $\overline{A'_i}$ equivalent to the address bit and its compliment for use in accessing desired memory locations during a write operation. Delay circuit 10 introduces a greater delay in transition of both $A'_i$ and $\overline{A'_i}$ from a column deselect level to a column select level than for a transition from a column select level to a column deselect level. This asymmetrical delay ensures that column select is slower than column deselect for a write operation to a memory device. This asymmetrical delay reduces the occurrence of a false write operation from being performed by the memory device.

Figure 2:
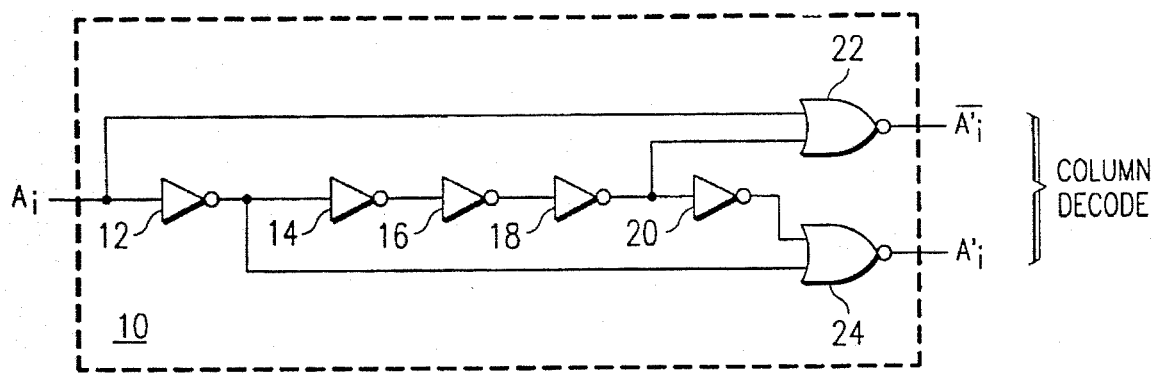
FIG. 2 illustrates a block diagram of an example of a column decode circuit that introduces asymmetrical delay.

FIG. 2 shows a specific example of delay circuit Delay circuit 10 includes a series of NOT gates 12, 14, 16, 18, and 20 serially connected within delay circuit 10. Delay circuit 10 also includes NOR gates 22 and 24 for generating address signals $\overline{A'_i}$ and $A'_i$. As an address bit $A_i$ is received at delay circuit 10, the address bit $A_i$ propagates through the NOT gates and the NOR gates that introduce the asymmetrical delay within delay circuit 10. Those skilled in the art will realize the operation of the circuit and that other types of delay circuits can be used. For example, the use of NAND logic instead of NOR logic, different members of NOT gates, or the use of resistors and/or capacitors to introduce delay can similarly produce the asymmetrical delay for column decoding.

Figure 3:
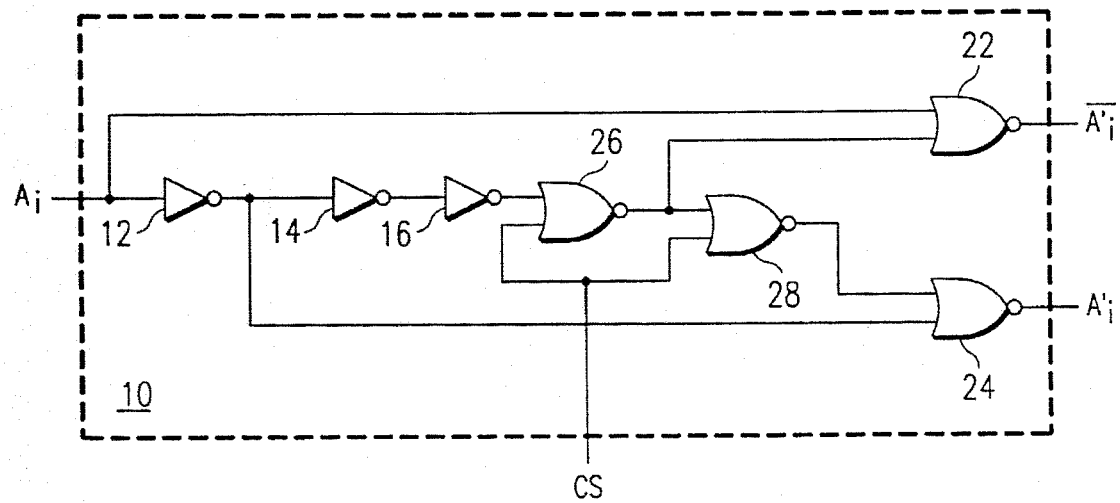
FIG. 3 illustrates a block diagram of an example of a column decode circuit that provides for disabling the asymmetrical delay.

FIG. 3 shows an example of a delay circuit 10 that can disable the asymmetrical delay. Delay circuit 10 includes a series of NOT gates 12, 14, and 16 serially connected to provide an input to a disable circuit including NOR gates 26 and 28. The disable circuit of NOR gates 26 and 28 connect to NOR gates 22 and 24 that generate the address signals $\overline{A'_i}$ and $A'_i$. Delay circuit 10 receives a control signal CS to control the disabling of the asymmetrical delay. During a write operation, delay circuit 10 of FIG. 3 operates similarly to delay circuit 10 of FIG. 2 where NOR gates 26 and 28 of the disable circuit behave similarly to NOT gates 18 and 20. Since unnecessary delay may be added by the asymmetrical delay in the column decoding during a read operation, control signal CS sets the output of NOR gates 26 and 28 to a low logic level so that NOR gates 22 and 24 will respond to both high going and low going transitions of $A_i$, respectively, without the delay introduced by NOT gates 14 and 16.

Control signal CS may be derived from the write enable signal or a fast access mode signal of the memory device. Delay circuit 10 may also be designed to receive a control signal to adjust the amount of asymmetrical delay placed onto the address signals by connecting or disconnecting elements within delay circuit 10. This elimination of the asymmetrical delay provides for a faster column access during a read operation of the memory device. This can be particularly important for memories with a fast access mode, e.g. where data is accessed from latches instead of from the main memory array.

Figure 4:
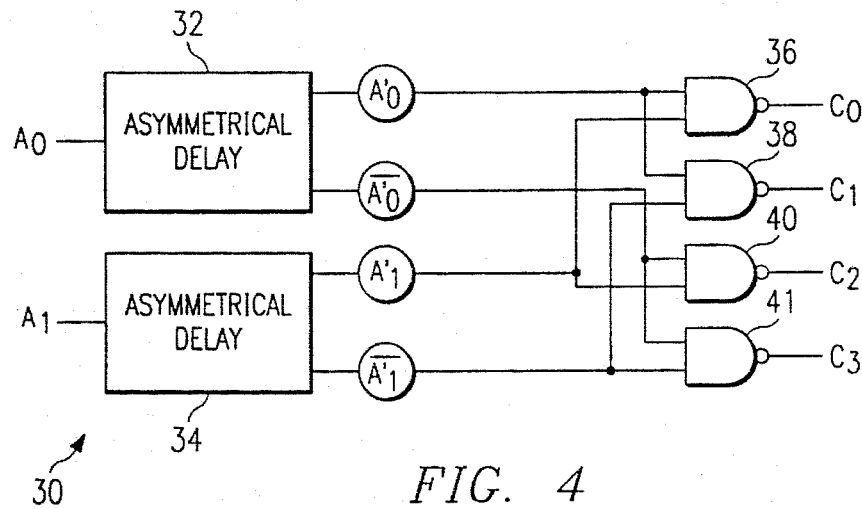
FIG. 4 illustrates a block diagram of a two bit column decode circuit that introduces asymmetrical delay.

FIG. 4 shows the use of a single bit decode circuit within an address decoder circuit 30. Though address decoder circuit 30 shows NAND logic to decode a two bit address resulting in four addresses, address decoder circuit 30 may be varied to decode more address bits and use other logic to obtain proper results. The address decoding may be done in multiple stages and the asymmetrical delay may be introduced at any stage or any combination of stages. Address decoder circuit 30 receives address bits $A_0$ and $A_1$ at delay circuits 32 and 34, respectively. Delay circuits 30 and 32 may be similar to those shown in FIGS. 2 and 3. Delay circuits 30 and 32 may also phase different amounts of delay on their respective output address signals. Delay circuits 30 and 32 generate address signals $A'_0$, $\overline{A'_0}$ and $A'_1$ and $\overline{A'_1}$, respectively. Address signal $A'_0$ is an input to NAND gates 36 and 38, address signal $\overline{A'_0}$ is an input to NAND gates 40 and 41, address signal $A'_1$ is an input to NAND gates 36 and 40, and address signal $\overline{A'_1}$ is an input to NAND gates 38 and 41. NAND gates 36, 38, 40, and 42 generate selection signals $C_0$, $C_1$, $C_2$, and $C_3$, respectively, where a low logic level is for select and a high logic level is for deselect.

Figure 5:
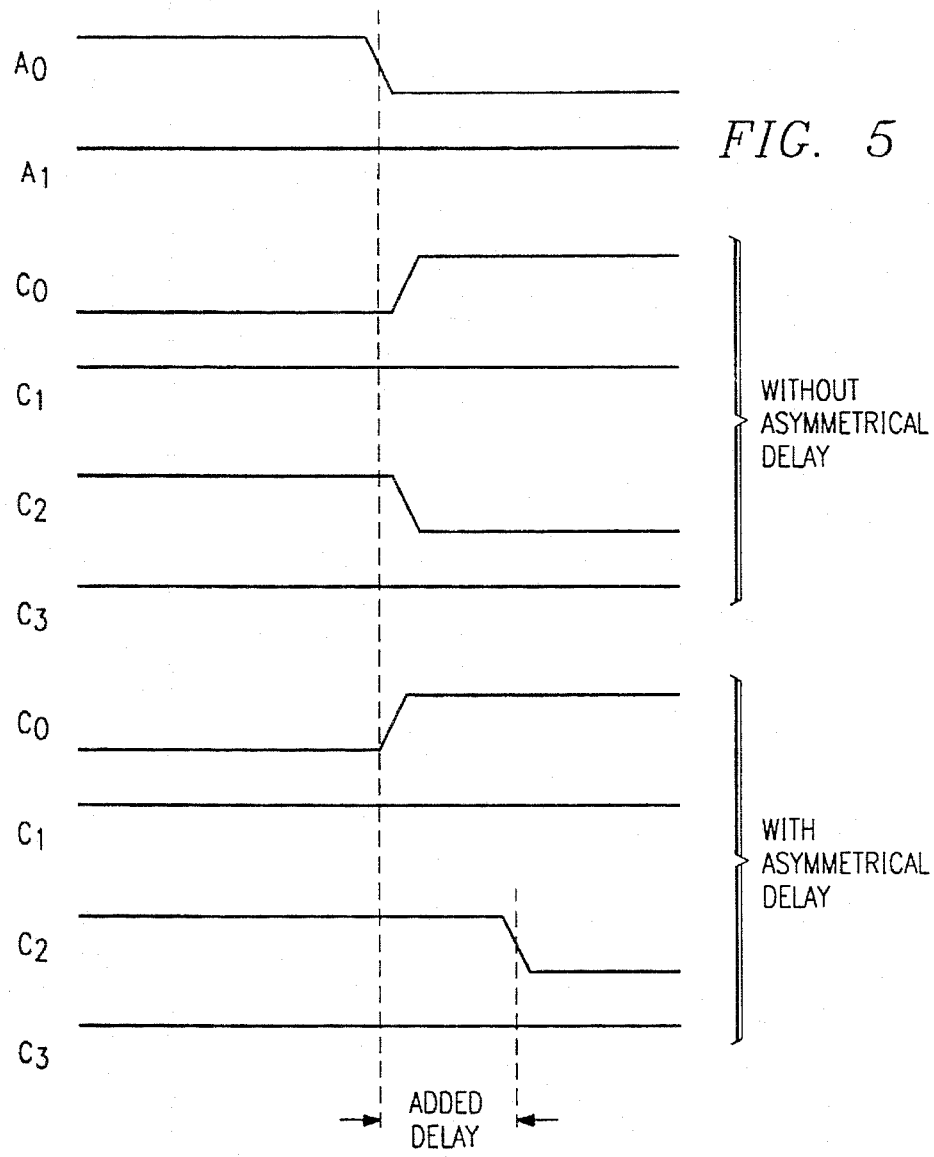
FIG. 5 illustrates a timing diagram depicting when asymmetrical delay is introduced.

The transition of the inputs to the NAND gates from low to high states determines the selection and the transition of either input from a high to low state determines the deselection. Selection signal $C_0$ is selected if decoded address bits $A'_0$ and $A'_1$ are at a logic one level state, selection $C_1$ is selected if decoded address bits $A'_0$ and $\overline{A'_1}$ are at a logic one level state, selection signal $C_2$ is selected if decoded address bits $\overline{A'_0}$ and $A'_1$ are at a logic one level state, and selection signal $C_3$ is selected if decoded address bits $\overline{A'_0}$ and $\overline{A'_1}$ are at a logic one level state. Through the insertion of asymmetrical delay, the decoded address bits have a faster transition from high to low states than the transition from low to high states. Therefore, upon transition of an address signal, selection signals will be deselected before another selection signal is selected. FIG. 5 shows the reaction of the selection signals in response to a transition of an address bit with and without asymmetrical delay. Note that with the asymmetrical delay, there is a time period during the transition in which no column is selected. This reduces the probability of a false write.

In summary, a column decode circuit introduces an asymmetrical delay that causes selection of a column to be slower than deselection of a column. The asymmetrical delay can be eliminated as desired during read operations of the memory device.

Thus, it is apparent that there has been provided, in accordance with the present invention, a method of performing a column decode in a memory device and apparatus thereof that satisfy the advantages set forth above. Although the preferred embodiment has been described in detail, it should be understood that various changes, substitutions, and alterations can be made herein. For example, a different type of circuit structure other than that shown for the column decode circuit may be used to introduce asymmetrical delay without adversely effecting the operation of the column decode circuit. Those skilled in the art will recognize that other decode circuits can be used employing other logic elements including NOR logic. Also, the asymmetrical delay in the preferred embodiment may be at the input for layout efficiency. Other examples are readily ascertainable by one skilled in the art and may be made without departing from the spirit and scope of the present invention as defined by the following claims.

What is claimed is:

1. A column decode circuit in a memory device, comprising:

an asymmetrical delay circuit operable to receive an address bit, said asymmetrical delay circuit operable to generate a column decode signal in response to said address bit, said asymmetrical delay circuit introducing a greater delay in said column decode signal during transition from an unselected state to a selected state than during transition from a selected state to an unselected state.

2. The column decode circuit of claim 1, wherein said asymmetrical delay circuit includes a series of NOT gates operable to introduce said delay.

3. The column decode circuit of claim 1, wherein said asymmetrical delay circuit generates a first column decode signal and a corresponding complimentary column decode signal.

4. The column decode circuit of claim 3, wherein said asymmetrical delay Circuit includes a pair of NOR gates operable to generate said first and complimentary column decode signals.

5. The column decode circuit of claim 1, wherein said asymmetrical delay circuit includes:

an address input;

a select output;

a logic gate with a first logic input, a second logic input, and a logic output, said first logic input connected to said address input, said logic output connected to said select output;

a delay element with a delay input and a delay output, said delay input connected to said address input, said delay output connected to said second logic input.

6. The column decode circuit of claim 1, further comprising:

a disable circuit coupled to said asymmetrical delay circuit, said disable circuit operable to receive a control signal for disabling said delay of said asymmetrical delay circuit.

7. The column decode circuit of claim 6, wherein said control signal is derived from a write enable signal of the memory device to disable said delay during a memory read operation.

8. The column decode circuit of claim 6, wherein said control signal is derived from a fast access mode signal of the memory device.

9. The column decode circuit of claim 6, wherein an amount of said delay is adjustable by said control signal.

10. The column decode circuit of claim 6, wherein said disable circuit prevents false writing to the memory device and eliminates delay during a read operation.

11. The column decode circuit of claim 1, wherein said asymmetrical delay circuit is at an input of the column decode circuit.

12. A method of performing a column decode in a memory device, comprising the steps of:

receiving an address bit;

generating a column decode signal in response to the address bit;

introducing an asymmetrical delay during generation of the column decode signal.

13. The method of claim 12, wherein the asymmetrical delay is introduced during a write operation.

14. The method of claim 12, further comprising the step of:

disabling introduction of the asymmetrical delay during a read operation.

15. The method of claim 14, wherein said disabling step is triggered by a write enable signal of the memory device.

16. The method of claim 12, wherein the asymmetrical delay forces a transition from column deselect to column select to be slower than a transition from column select to column deselect during a write operation to the memory device.

17. A memory device, comprising:

a column decode circuit, said column decode circuit operable to introduce asymmetrical delay into a column selection operation such that a transition from column deselect to column select is slower than a transition from column select to column deselect.

18. The memory device of claim 17, wherein said column decode circuit is operable to prevent said introduction of said asymmetrical delay into said column selection operation.

19. The memory device of claim 18, wherein introduction of asymmetrical delay is prevented during a memory read operation.

20. The memory device of claim 17, wherein said column decode circuit is operable to adjust an amount of said asymmetrical delay.

* * * * *